(12) United States Patent
Kumar et al.

(10) Patent No.: US 11,509,323 B2
(45) Date of Patent: *Nov. 22, 2022

(54) ADAPTIVE LOW POWER COMMON MODE BUFFER

(71) Applicant: STMicroelectronics International N.V., Geneva (CH)

(72) Inventors: Anand Kumar, Noida (IN); Ramji Gupta, Jhansi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/245,592

(22) Filed: Apr. 30, 2021

(65) Prior Publication Data

US 2021/0250036 A1    Aug. 12, 2021

Related U.S. Application Data

(63) Continuation of application No. 16/896,950, filed on Jun. 9, 2020, now Pat. No. 11,025,263.

(60) Provisional application No. 62/862,190, filed on Jun. 17, 2019.

(51) Int. Cl.
*H03M 1/12* (2006.01)

(52) U.S. Cl.
CPC .................................. *H03M 1/124* (2013.01)

(58) Field of Classification Search
CPC ...... H03M 1/124; H03M 1/002; H03M 1/126; H03M 1/466; H03M 1/38
See application file for complete search history.

(56) References Cited

U.S. PATENT DOCUMENTS

| | | |
|---|---|---|
| 4,631,518 A | 12/1986 | Caspell |
| 7,750,837 B2 | 7/2010 | Wang et al. |
| 7,821,441 B2 | 10/2010 | Westwick et al. |
| 8,779,963 B1 | 7/2014 | Bales |
| 9,088,292 B1 | 7/2015 | Pereira et al. |
| 9,143,146 B1 | 9/2015 | Pereira et al. |
| 9,219,490 B1 | 12/2015 | Pereira et al. |
| 9,595,974 B1 | 3/2017 | Pereira et al. |
| 11,025,263 B2 * | 6/2021 | Kumar ................ H03F 3/45995 |

(Continued)

OTHER PUBLICATIONS

Mostafa, Salwa, et al: "A Calibration Circuit for Reconfigurable Smart ADC for Biomedical Signal Processing," 2010 IEEE Annual Symposium on VLSI, p. 185-189.

(Continued)

*Primary Examiner* — Lam T Mai
(74) *Attorney, Agent, or Firm* — Crowe & Dunlevy

(57) ABSTRACT

A circuit includes an amplifier having first and second inputs and an output, and a feedback circuit configured to generate a feedback voltage in response to a voltage at the output of the amplifier. The feedback circuit is coupled to the first input of the amplifier to provide the feedback voltage to the first input of the amplifier. An output circuit is configured to generate a variable bias current in response to the voltage at the output of the amplifier. A switch circuit is configured to switch the second input of the amplifier from receiving a first reference voltage during a first mode of operation to receiving a second reference voltage during a second mode of operation.

23 Claims, 6 Drawing Sheets

(56) References Cited

U.S. PATENT DOCUMENTS

| | | | |
|---|---|---|---|
| 2007/0098027 A1* | 5/2007 | Saitoh | H01S 5/042 372/29.011 |
| 2008/0079622 A1 | 4/2008 | Dura et al. | |
| 2008/0238753 A1 | 10/2008 | Dura et al. | |
| 2011/0121886 A1 | 5/2011 | Jeon | |
| 2015/0002324 A1 | 1/2015 | Sharma et al. | |
| 2015/0061621 A1* | 3/2015 | Pons | G05F 1/575 323/280 |
| 2017/0373640 A1* | 12/2017 | Yin | H03D 7/1441 |
| 2020/0136631 A1 | 4/2020 | Naru et al. | |

OTHER PUBLICATIONS

Huang, Mu-Chen, et al: "A 10-MS/s-to-100-kS/s Power-Scalable Fully Differential CBSC 10-Bit Pipelined ADC With Adaptive Biasing," IEEE Translations on Circuits and Systems—II: Express Briefs, vol. 57, No. 1, Jan. 2010, pp. 11-15.

* cited by examiner

ADAPTIVE LOW POWER COMMON MODE BUFFER

RELATED APPLICATION

This application is a continuation of U.S. application patent Ser. No. 16/896,950, filed Jun. 9, 2020, which in turn claims priority to U.S. Provisional Application Patent No. 62/862,190, filed Jun. 17, 2019, the contents of both of which are incorporated by reference to the maximum extent allowable under the law.

TECHNICAL FIELD

This disclosure is directed to the field of analog to digital conversion and, in particular, to an adaptive common mode buffer with conversion rate dependent power consumption for analog to digital converters.

BACKGROUND

Analog to digital converters (ADCs) are routinely used to convert an analog signal to a series of n-bit digital values. As an example, one popular form of analog to digital converter is a successive approximation based ADC.

A known successive approximation based ADC 1 is shown in FIG. 1. The ADC 1 includes a bias circuit 2 that generates bias currents for a common mode buffer 3 and a comparator 6. The common mode buffer 3 provides a common mode voltage VCM for use by a digital to analog converter (DAC) 4 and a sample hold (S/H) circuit 8 internal to the ADC 1. The DAC 4 receives a reference voltage VREF as well as a series of control signals for switches internal to the DAC 4, this series of control signals being referred to collectively as the SAR control signal SARCtrl which is output from the successive approximation register (SAR) control logic 7. An input analog signal VIN is coupled to a sample/hold circuit 8, which in turn provides its output to the non-inverting terminal of the comparator 6. The inverting terminal of the comparator 6 receives the output of the DAC 4. The output of the comparator 6 is fed to a reset input of the SAR control logic 7. The SAR control logic 7 also receives the clock CLK as input, and also provides an end of conversion (EOC) signal indicating that the ADC 1 has completed conversion of one sample of the input signal VIN and has output the discrete digital representation D of the input signal VIN.

In operation, the ADC 1 converts the analog input signal VIN into the discrete digital representation D via performing a binary search through all possible quantization levels before finally converging upon a digital output. When the ADC 1 is operated at its highest conversion rate, it operates efficiently. However, a problem arises when this ADC 1 is operated at a lower conversion rate. The total power consumption does not scale down linearly with respect to the conversion rate due to the power consumption of the VCM buffer 3. One known technique for addressing this problem is to use a bias circuit 2 capable of generating multiple discrete bias currents Ibias in response to programming bits. While this technique may work, it has the drawback of working properly only at specific conversion rates, thus limiting flexibility. In addition, this technique has the drawback of additional complexity in that circuitry for generating and altering the programming bits is needed.

Therefore, development of ADCs capable of efficient power consumption across their entire range of conversion rates is still needed.

SUMMARY

Disclosed herein is an analog to digital converter (ADC) including a conversion circuit configured to digitize an input analog signal at a conversion rate to produce an output digital signal, a current generator configured to generate a constant bias current, and a variable bias current generator to generate a variable bias current from the constant bias current. The variable bias current has a first magnitude during sampling by the conversion circuit, and has a second magnitude outside of sampling by the second conversion circuit, the second magnitude being less than the first magnitude. A buffer is configured to generate a common mode voltage from the variable bias current for use by the conversion circuit.

The variable bias current may decay from the first magnitude to the second magnitude exponentially in response to a change by the conversion circuit from not sampling to sampling.

The variable bias current may decay from the first magnitude to the second magnitude linearly in response to a change by the conversion circuit from not sampling to sampling. The variable bias current generator may include an operational amplifier having first and second inputs and an output, and a feedback transistor circuit generating a feedback voltage in response to a voltage at the output of the operational amplifier, with the feedback transistor being coupled to the first input of the operational amplifier to provide the feedback voltage to the first input of the operational amplifier. An output transistor may generate the variable bias current in response to the voltage at the output of the operational amplifier, and a switch circuit may be configured to switch the second input of the operational amplifier from receiving a first reference voltage outside of sampling to receiving a second reference voltage during sampling.

The current generator may be coupled between a second reference voltage and a first switch. The switch circuit may include a capacitor coupled between the second input of the operational amplifier and ground, a first switch coupled between an output of the current generator and the second input of the operational amplifier, and a second switch coupled between a first reference voltage and the second input of the operational amplifier. The first switch may open and the second switch may close, outside of sampling. In addition, the second switch may close and the first switch may open, during sampling.

The variable bias current generator may include a current mirror circuit having an input transistor configured to receive the constant bias current, an output transistor in a mirroring relationship with the input transistor and configured to generate a variable bias current, and a parallel transistor circuit configured to selectively couple a parallel transistor in parallel with the input transistor or the output transistor in response to a control signal, the control signal being representative of the conversion rate.

The control signal may be asserted during each digitizing of the input analog signal and deasserted between each assertion of the input analog signal.

The current mirror circuit may also include a configurable resistor-capacitor (RC) filter coupled to control terminals of the input transistor and output transistor, with an RC time constant of the configurable RC filter changing as a function of a complement of the control signal.

The configurable RC filter may include a resistor coupled in series between the control terminals of the input transistor and the output transistor, a capacitor coupled between the control terminal of the output transistor and ground, and a parallel transistor selectively shorting the resistor in response to assertion of the complement of the control signal.

The parallel transistor may be coupled in parallel with the input transistor or output transistor in response to assertion of the control signal, and may be decoupled from the parallel coupling in response to deassertion of the control signal.

The input transistor may be a first NMOS transistor having a drain receiving the constant bias current, a gate coupled to the drain of the first NMOS transistor, and a source. The output transistor may be a second NMOS transistor having a source coupled to the source of the first NMOS transistor, a gate coupled to the gate of the first NMOS transistor, and a drain at which the variable bias current is generated. In addition, the parallel transistor circuit may include the parallel transistor, the parallel transistor being a third NMOS transistor having a source coupled to the source of the first NMOS transistor and a drain coupled to the drain of the first NMOS transistor, and a fourth NMOS transistor having a drain coupled to the gates of the first and second NMOS transistors, a source coupled to a gate of the third NMOS transistor, and a gate coupled to the control signal.

The parallel transistor circuit may also include a fifth NMOS transistor having a drain coupled to the gate of the third NMOS transistor and drain of the fourth NMOS transistor, a source coupled to the drain of the first NMOS transistor and the drain of the third NMOS transistor, and a gate coupled to a complement of the control signal.

A resistor may couple the gate of the first NMOS transistor to the gate of the second NMOS transistor. A sixth NMOS transistor may have a source coupled to a first terminal of the resistor, a drain coupled to a second terminal of the resistor, and a gate coupled to the complement of the control signal. A capacitor may be coupled between the first terminal of the resistor and ground.

The parallel transistor circuit is configured to selectively couple one or more additional parallel transistors in parallel with the input transistor or the output transistor in response to the control signal.

Also disclosed herein is an electronic circuit including a bias current generator configured to generate a bias current, and a current mirror circuit. The current mirror circuit includes an input transistor configured to receive the bias current, an output transistor in a mirroring relationship with the input transistor and configured to generate a variable bias current based upon the bias current, and a parallel transistor circuit configured to selectively couple a parallel transistor in parallel with the input transistor or the output transistor in response to a control.

The current mirror circuit further may include a configurable RC filter coupled to control terminals of the input transistor and output transistor.

The configurable RC filter may include a resistor coupled in series between the control terminals of the input transistor and the output transistor, a capacitor coupled between the first terminal of the resistor and ground, and a transistor selectively shorting the resistor.

Also disclosed herein is a method of generating a variable bias current for use in an analog to digital converter (ADC), the ADC having a conversion rate. The method includes generating a constant bias current, and using a current mirror to mirror the constant bias current to produce the variable bias current by: mirroring the constant bias current from an input transistor of the current mirror to an output transistor of the current mirror, during each generation of a digital sample from an input analog signal coupling an additional transistor in parallel with the input transistor or output transistor so as to vary the constant bias current to form the variable bias current, and while not generating a digital sample from the input analog signal, decoupling the additional transistor.

The method may also include reducing an RC time constant of a RC filter coupled to control terminals of the input transistor and output transistor, while not generating a digital sample from the input analog signal.

Also disclosed herein is an analog to digital converter (ADC) including a conversion circuit configured to digitize an input analog signal to produce an output digital signal, a variable bias current generator, and a buffer. The variable bias current generator generates a variable bias current from a constant bias current, the variable bias current having a first magnitude during sampling by the conversion circuit, and having a second magnitude outside of sampling by the conversion circuit. The buffer generates a common mode voltage for use by the conversion circuit, from the variable bias current.

The variable bias current may decay from the first magnitude to the second magnitude exponentially in response to a change by the conversion circuit from not sampling to sampling.

The variable bias current may decay from the first magnitude to the second magnitude linearly in response to a change by the conversion circuit from not sampling to sampling.

The variable bias current generator may include an operational amplifier, and a feedback transistor circuit generating a feedback voltage in response to a voltage at an output of the operational amplifier, the feedback transistor circuit providing the feedback voltage to the operational amplifier. The variable bias current generator may also include an output transistor generating the variable bias current in response to output of the operational amplifier, and a switch circuit configured to switch the operational amplifier from receiving a first reference voltage outside of sampling to receiving a second reference voltage during sampling.

A current generator may be coupled between a second reference voltage and a first switch. The switch circuit may include a capacitor coupled between the operational amplifier and ground, the first switch being coupled between an output of the current generator and the operational amplifier, and a second switch coupled between a first reference voltage and the operational amplifier. The first switch may open and the second switch may close, outside of sampling, and the second switch may close and the first switch may open, during sampling.

The variable bias current generator may include a current mirror circuit. The current mirror may include an input transistor configured to receive the constant bias current, an output transistor in a mirroring relationship with the input transistor and configured to generate a variable bias current, and a parallel transistor circuit configured to selectively couple a parallel transistor in parallel with the input transistor or the output transistor in response to a control signal, wherein the control signal is representative of a conversion rate.

The control signal may be asserted during each digitizing of the input analog signal and deasserted between each assertion of the input analog signal.

Also disclosed herein is an amplifier having a first input, a second input and an output. A feedback circuit is configured to generate a feedback voltage in response to a voltage at the output of the amplifier, the feedback circuit being coupled to the first input of the amplifier to provide the feedback voltage to the first input of the amplifier. An output circuit is configured to generate a variable bias current in response to the voltage at the output of the amplifier, and a switch circuit is configured to switch the second input of the amplifier from receiving a first reference voltage during a first mode of operation to receiving a second reference voltage during a second mode of operation.

The feedback circuit may be a feedback transistor circuit. The feedback transistor circuit may include a first transistor having a first source/drain coupled to a first supply voltage through a resistor, a second source/drain directly electrically connected to a second supply voltage, and a gate directly electrically connected to the output of the amplifier, wherein the first source/drain of the first transistor is also directly electrically connected to the first input of the amplifier.

The output circuit may be an output transistor circuit. The output transistor circuit may be a second transistor having a first source/drain selectively coupled through a second switch circuit to provide the variable bias current, a second source/drain directly electrically connected to a second supply voltage, and a gate directly electrically connected to the output of the amplifier.

The first mode of operation may be when a conversion circuit is not digitizing an input analog signal. The second mode of operation may be when a conversion circuit is digitizing an input analog signal.

The switch circuit may include a first switch. A current generator may generate a constant bias current is selectively coupled between the second reference voltage and the second input of the amplifier by the first switch, and the first switch may be configured to open during the first mode of operation, and to close during the second mode of operation.

A capacitor may be coupled between the second input of the amplifier and a second supply voltage.

A buffer may be configured to generate a common mode voltage from the variable bias current.

Also disclosed herein is an analog to digital converter (ADC). The ADC includes a conversion circuit configured to digitize an input analog signal to produce an output digital signal at a conversion rate, based upon a common mode voltage applied to the conversion circuit. A variable bias current generator is configured to generate a variable bias current that changes based upon whether the conversion circuit is digitizing the input analog signal. A buffer is configured to generate the common mode voltage from the variable bias current for use by the conversion circuit.

The variable bias current may decay in magnitude in response to a change by the conversion circuit from not digitizing to digitizing. The decay of the variable bias current may be exponential. The decay of the variable bias current may be linear.

The variable bias current generator may include a current mirror circuit receiving a constant bias current at its input and generating a variable bias current at its output in response to the constant bias current, and a parallel transistor circuit configured to selectively couple in parallel with the input of the current mirror circuit in response to a control signal representative of a conversion rate of the digitizing, and configured to selectively couple in parallel with the output of the current mirror circuit in response to a control signal representative of a conversion rate of the digitizing.

The control signal may be asserted during each digitizing of the input analog signal and may be deasserted between each assertion of the input analog signal.

The variable bias current generator may include an amplifier having first and second inputs and an output, and a feedback circuit configured to generate a feedback voltage in response to a voltage at the output of the amplifier, the feedback circuit being coupled to the first input of the amplifier to provide the feedback voltage to the first input of the amplifier. An output circuit may be configured to generate the variable bias current in response to the voltage at the output of the amplifier. A switch circuit may be configured to switch the second input of the amplifier from receiving a first reference voltage to receiving a second reference voltage dependent upon whether the conversion circuit is digitizing the input analog signal.

The feedback circuit may include a feedback transistor circuit. The feedback transistor circuit may include a first transistor having a first source/drain coupled to a first supply voltage through a resistor, a second source/drain directly electrically connected to a second supply voltage, and a gate directly electrically connected to the output of the amplifier, wherein the first source/drain of the first transistor is also directly electrically connected to the first input of the amplifier.

The output circuit may include an output transistor circuit. The output transistor circuit may include a second transistor having a first source/drain selectively coupled through a second switch circuit to provide the variable bias current, a second source/drain directly electrically connected to a second supply voltage, and a gate directly electrically connected to the output of the amplifier.

The switch circuit may include a first switch. A current generator may generate a constant bias current and may be selectively coupled between the second reference voltage and the second input of the amplifier by the first switch. The first switch may be configured to open during a first mode of operation, and to close during a second mode of operation.

A capacitor may be coupled between the second input of the amplifier and a second supply voltage.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

As an initial matter, it should be understood that the biasing and adaptive biasing control circuits disclosed herein are usable with any ADC design that utilizes a common mode voltage in its operation. Therefore, the various embodiments of ADC designs described herein are simply example use cases, and the biasing and adaptive biasing control circuits described herein are not limited to use with these embodiments.

Figure 1:
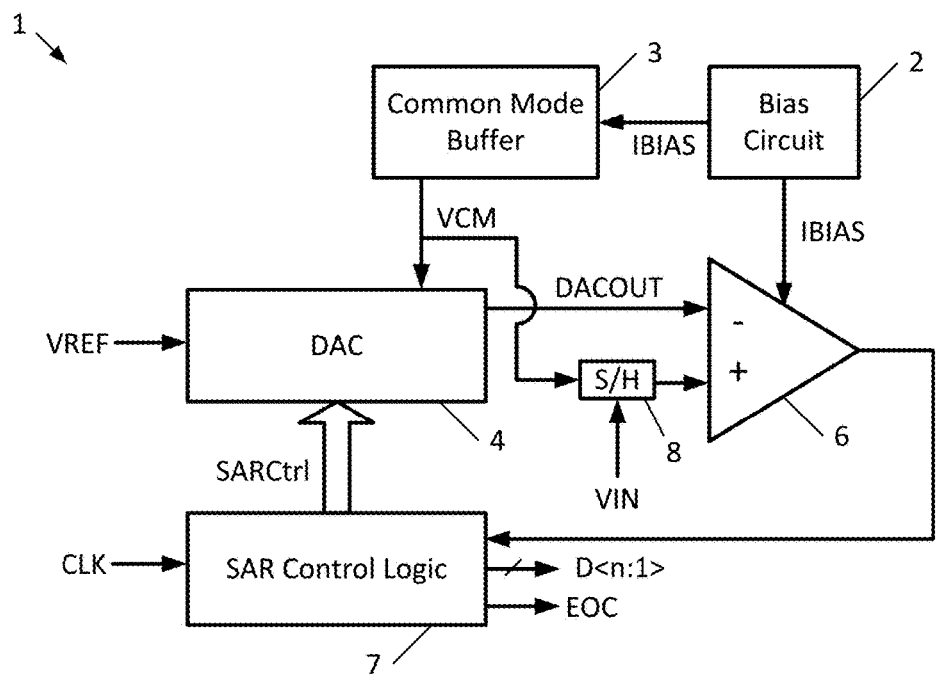
FIG. 1 is a schematic block diagram of a prior art successive approximation (SAR) based analog to digital converter (ADC).
Figure 2A:
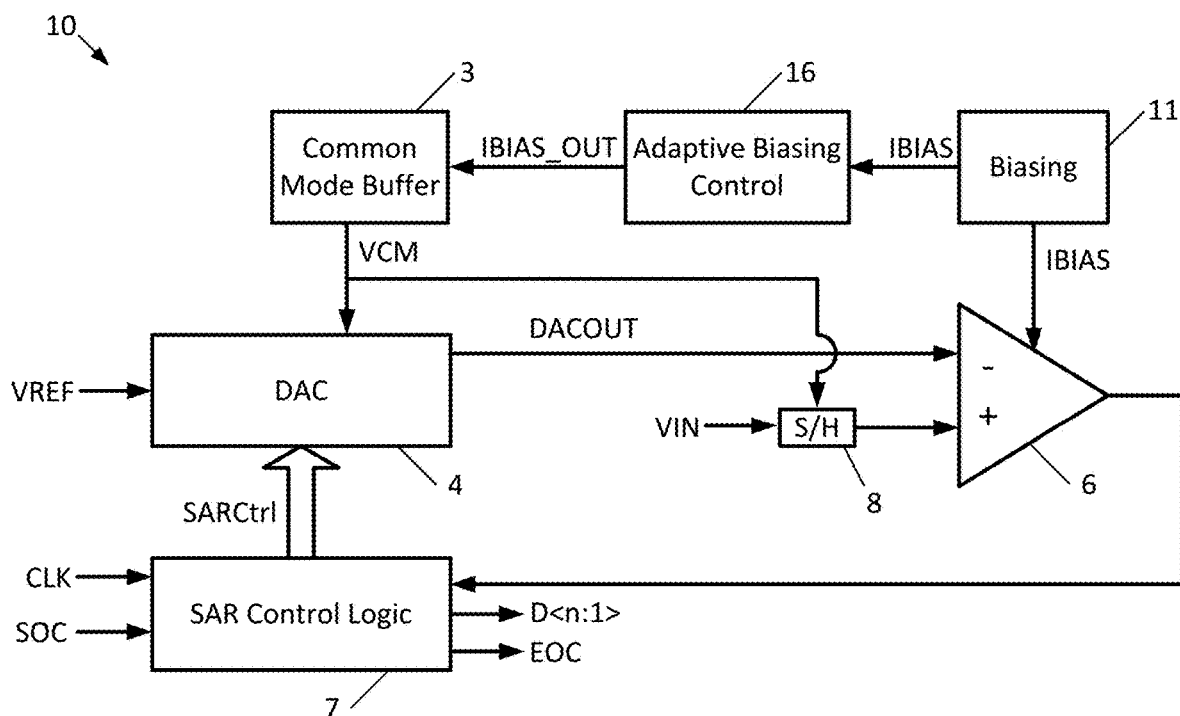
FIG. 2A is a schematic block diagram of a SAR based ADC utilizing adaptive biasing control disclosed herein.

Beginning with FIG. 2A, a first embodiment of an ADC 10 design such as may utilize the biasing circuit 11 and adaptive biasing control circuit 16 taught herein is now described. The ADC 10 includes a biasing circuit 11 that generates a constant bias current IBIAS for use by a comparator 6 and for use by an adaptive biasing control circuit 16 to generate a variable bias current IBIAS_OUT for use by a common mode buffer 3. The common mode buffer 3 provides a common mode voltage VCM for use by a digital to analog converter (DAC) 4 and sample/hold (S/H) circuit 8 internal to the ADC 1 outside of conversion phases, with the common mode buffer 3 being off during conversion.

As will be explained in detail below, the average value of variable bias current IBIAS_OUT in one conversion cycle is proportional to the conversion rate of the ADC 10, meaning that as the conversion rate falls, the magnitude of IBIAS_OUT falls. This serves to reduce power consumption by the common mode buffer 3 at conversion rates less than the maximum conversion rate of the ADC 10.

First, however, the remainder of the ADC 10 will be described, as will be its operation. The DAC 4 receives a reference voltage VREF as well as a series of control signals for switches internal to the DAC 4, this series of control signals being referred to collectively as the SAR control signal SARCtrl which is received from the successive approximation register (SAR) control logic 7. An input analog signal VIN is coupled to a sample/hold circuit 8, which in turn provides its output to the non-inverting terminal of the comparator 6. The inverting terminal of the comparator 6 receives the output of the DAC 4. The output of the comparator 6 is fed to a reset input of the SAR control logic 7. The SAR control logic 7 also receives the clock CLK and a start of conversion (SOC) signal that is asserted to cause the SAR control logic 7 to begin generating a sample of VIN. The SAR control logic 7 provides an end of conversion (EOC) signal indicating that the ADC 1 has completed the conversion of one sample of the input signal VIN and has output the digital representation of the input signal VIN as digital signal D.

In operation, to begin a conversion of the input signal VIN to a digital representation D, the SAR control logic 7 is initialized upon assertion of the SOC signal so that the most significant bit (MSB) of SARCtrl is equal to a digital "1". SARCtrl is fed to the DAC 4, which then supplies the analog equivalent of SARCtrl (which in the case of a digital 1, would be VREF/2) as an analog voltage signal DACOUT to the comparator 6 for comparison with a sample of the voltage of the input signal VIN from the sample/hold circuit 8. If this analog voltage DACOUT exceeds Vin, the comparator 6 causes the SAR control logic 7 to reset this bit; otherwise, this bit is left as 1. Then the next bit is set to 1 and the same test is done. This binary search is continued until every bit in the SAR control logic 7 has been tested. The resulting output D is the digital approximation of the input signal VIN and is finally output by the SAR control logic 7 at the end of the conversion. At the end of conversion, the EOC signal is asserted.

Figure 2B:
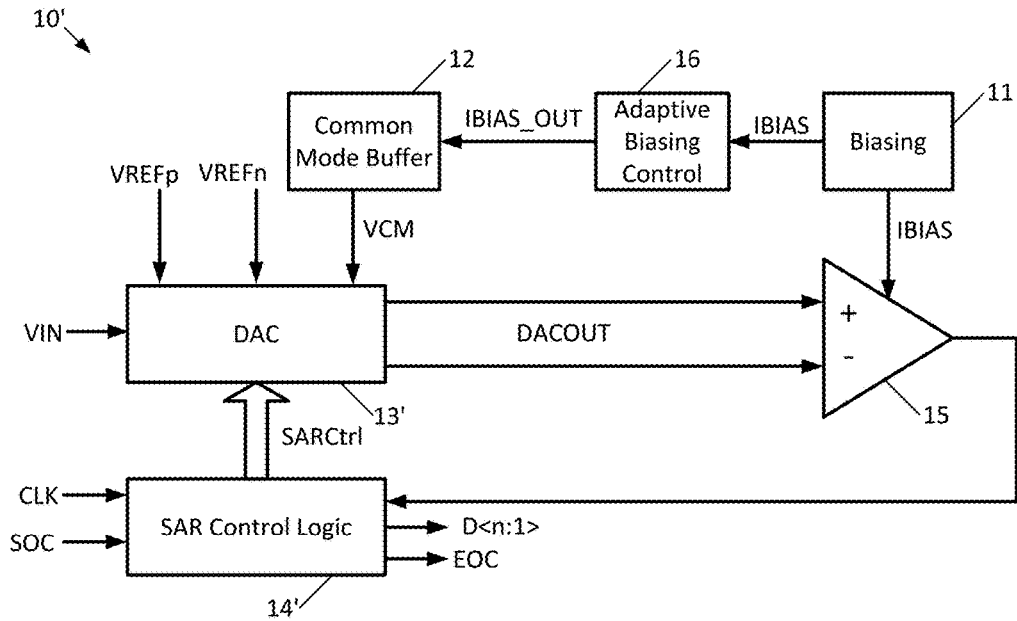
FIG. 2B is a schematic block diagram of another SAR based ADC utilizing adaptive biasing control disclosed here.

Another example embodiment incorporating the biasing circuit 11 and adaptive biasing control circuit 16 is now described with reference to the ADC 10' of FIG. 2B. The difference between this ADC 10' and the ADC 10 of FIG. 2A is that the ADC 10' utilizes a bottom plate sampling DAC 13'. In particular, here, the DAC 13' receives the input signal VIN, and here the reference signal is differential in form, meaning that the DAC 13' receives reference signals VREFp and VREFn.

Figure 2C:
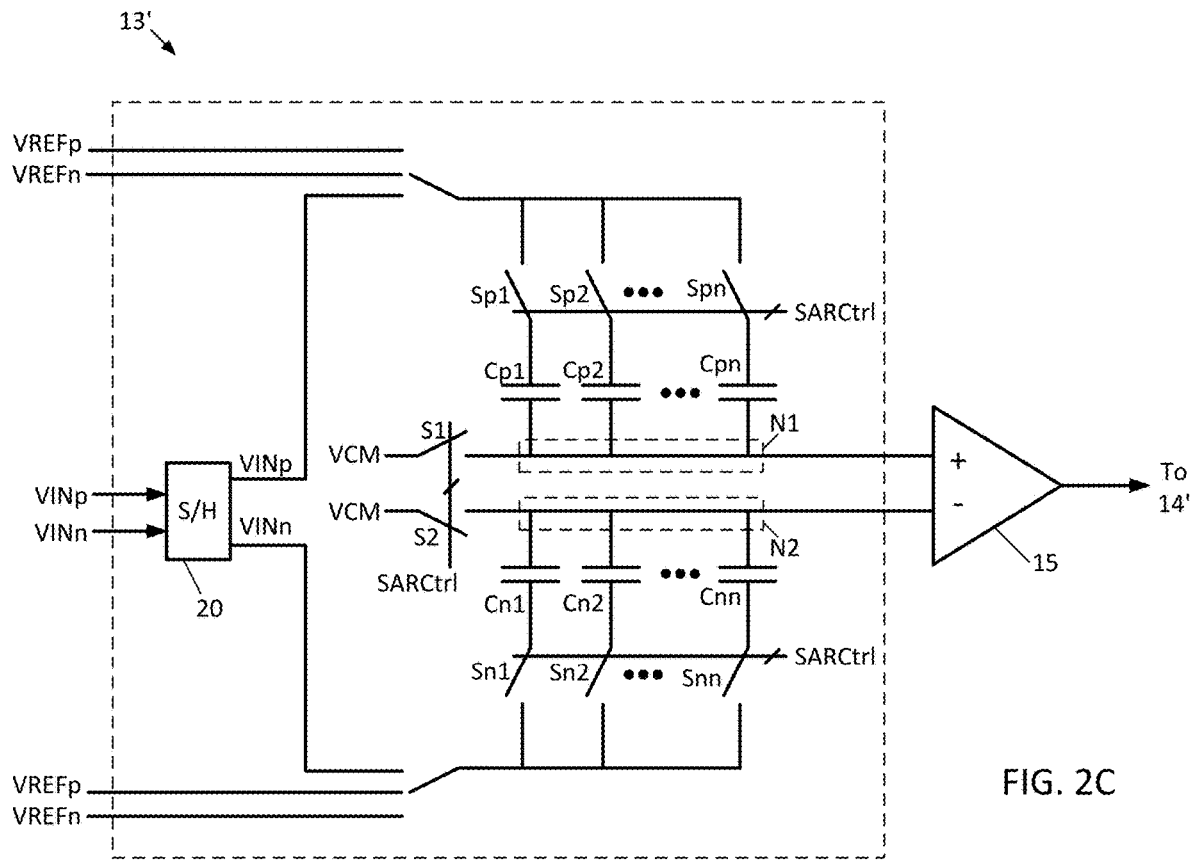
FIG. 2C is a schematic diagram of the digital to analog converter (DAC) of FIG. 2B.

The structure of the DAC 13' is shown in FIG. 2C. Here, it can be seen that a sample/hold circuit 20 is internal to the DAC 13' and receives the differential signals VINp and VINn.

A first series of capacitors Cp1, ..., Cpn are connected between a first node N1 and a first series of switches Sp1, ..., Spn. The first node N1 is connected to the non-inverting terminal of the comparator 15, and is selectively connected to the common mode voltage VCM by switch S1. The switches Sp1, ..., Spn selectively connect the capacitors Cp1, ..., Cpn to VREFp, VREFn, or VINp.

A second series of capacitors Cn1, ..., Cnn are connected between a second node N2 and a second series of switches Sn1, ..., Snn. The second node N2 is connected to the inverting terminal of the comparator 15, and is selectively connected to the common mode voltage VCM by switch S2. The switches Sn1, ..., Snn selectively connect the capacitors Cn1, ..., Cnn to VREFn, VREFp, or VINn.

Switches S1, S2, Sp1, ..., Spn, and Sn1, ..., Snn are controlled by the SAR control signal SARCtrl, and it is pointed out that SARCtrl is a multi-bit digital signal, with each bit of the digital signal connected to control selective actuation of a corresponding one of the switches. In operation, the overall ADC 10' operation remains the same as the ADC 10', with it being noted that the switches S1, S2, Sp1, ..., Spn, ..., Sn1, Snn are selectively switched by the individual bits of the SARCtrl signal so as to operate the DAC 13' as a typical "bottom plate sampling" DAC.

Figure 3A:
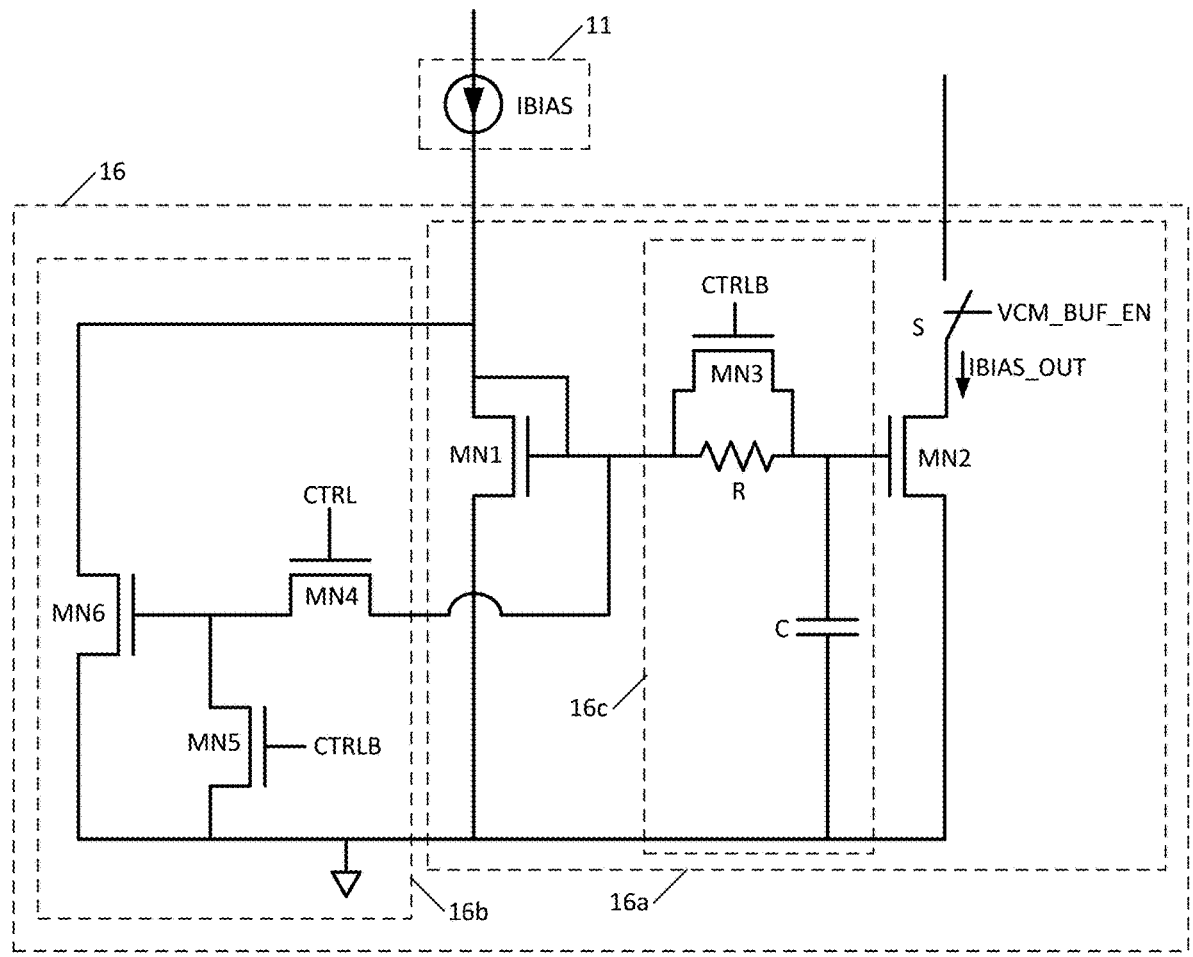
FIG. 3A is a schematic diagram of the biasing and adaptive biasing control circuits of FIGS. 2A-2B.

The biasing circuit 11 and adaptive biasing control circuit 16 are now described in detail with reference to FIG. 3A.

The biasing circuit 11 comprises a constant current source generating the constant bias current IBIAS.

The adaptive biasing control circuit 16 is comprised of a current mirror circuit 16a and a parallel transistor circuit 16b.

The current mirror circuit 16a is now described and includes an NMOS transistor MN1 having a source connected to ground, a drain connected to the biasing circuit 11 to receive the constant bias current IBIAS, and a gate connected to the drain. An NMOS transistor MN2 has a source connected to ground, a drain at which the variable bias current IBIAS_OUT is generated, and a gate. The drain of NMOS transistor MN2 is selectively connected or disconnected from providing output by a switch S2. The switch S2 is controlled by the VCM buffer enable signal VCM_BUF_EN, such that when VCM_BUF_EN is high, IBIAS_OUT is generated as described below, but when VCM_BUF_EN is low, IBIAS_OUT is zero.

A resistor R connects the gates of NMOS transistors MN1 and MN2, and a capacitor C is connected between the gate of NMOS transistor MN2 and ground. The resistor R and capacitor C form a resistor-capacitor (RC) circuit 16c. NMOS transistor MN3 has its drain connected to the gate of NMOS transistor MN1, has its source connected to the gate of NMOS transistor MN2, and has its gate connected to a complement CTRLB of the control signal (which is shown elsewhere as CTRL).

The parallel transistor circuit 16b is now described and includes an NMOS transistor MN6 having a drain connected to the drain of NMOS transistor MN1, a source connected to ground. An NMOS transistor MN4 has a drain connected to the gate of NMOS transistor MN1, a source connected to the gate of NMOS transistor MN6, and a gate connected to the control signal CTRL. An NMOS transistor MN5 has a drain connected to the gate of NMOS transistor MN6, a source connected to ground, and a gate connected to the complement CTRLB of the control signal.

To understand the operation of the adaptive biasing control circuit 1, first it should be understood that assertion of the control signal CTRL indicates that the ADC 10 is currently generating a sample and assertion of its complement CTRLB indicates that the ADC 10 is not currently generating a sample. As such, the frequency of the control signal CTRL and its complement CTRLB are equal to the current sampling frequency of the ADC 10. In the context of the ADC 10 described above, therefore, CTRL transitions high when the start of capture signal SOC is asserted and transitions low when the end of capture signal EOC is asserted, remaining low until the start of capture signal SOC is again asserted. Therefore, it follows that CTRLB transitions high when the end of capture signal EOC is asserted and transitions low when the start of capture signal SOC is asserted, remaining low until the end of capture signal EOC is again asserted.

Figure 3B:
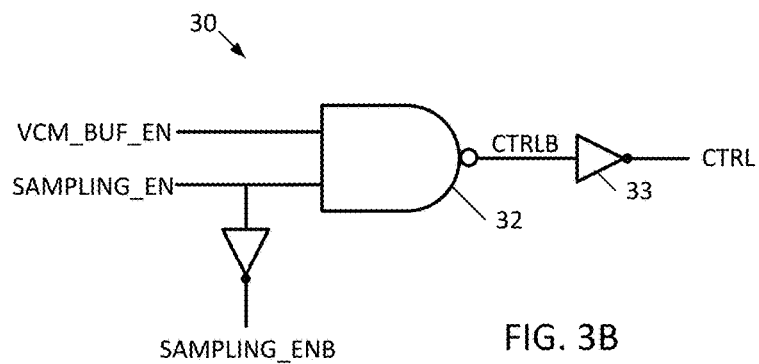
FIG. 3B is a schematic diagram showing logic for generation of the control signal and its complement, as used by the adaptive biasing control circuit of FIG. 3A.

A sample logic circuit 30 for generating the control signal CTRL and its complement CTRLB is shown in FIG. 3B. The logic circuit includes a NAND gate 32 receiving as input the VCM buffer enable signal VCM_BUF_EN and a sampling enable signal SAMPLING_EN, and outputting the complement of the control signal CTRLB as a result of a logical NAND operation there between. An inverter 33 receives the control signal CTRLB from the AND gate 32, and generates the control signal CTRL.

Referring back to FIG. 3A, as stated, when the ADC 10 is not currently generating a sample, CTRL will be low, while CTRLB will be high. The result of this is that NMOS transistor MN3 turns on, shorting resistor R. At the same time, NMOS transistor MN5 turns on, shunting the gate of NMOS transistor MN6 to ground, and the NMOS transistor MN4 turns off, disconnecting and decoupling the gate of the NMOS transistor MN6 from the gate of transistor MN1. The result of this is that the NMOS transistor MN6 will disconnected and decoupled from NMOS transistor MN1, and the constant bias current IBIAS will be mirrored to the drain of NMOS transistor MN2 as the variable bias current IBIAS_OUT.

When the ADC 10 is currently generating a sample, CTRL will be high, while CTRLB will be low. This serves to turn on NMOS transistor MN4 and turn off NMOS transistor MN5, with the result being that the NMOS transistor MN6 is connected in parallel with the NMOS transistor MN1. This therefore increases the effective size of NMOS transistor MN1, the effect of which is to reduce the gate voltage seen by NMOS transistor MN1. Note that this operation also turns off NMOS transistor MN3, increasing the RC time constant of the RC filter 16c, and causing a gradual reduction of IBIAS_OUT. Therefore, as the gate voltage falls (as per the RC time constant of the RC filter 16c) the magnitude of the variable bias current IBIAS_OUT falls.

Figure 4:
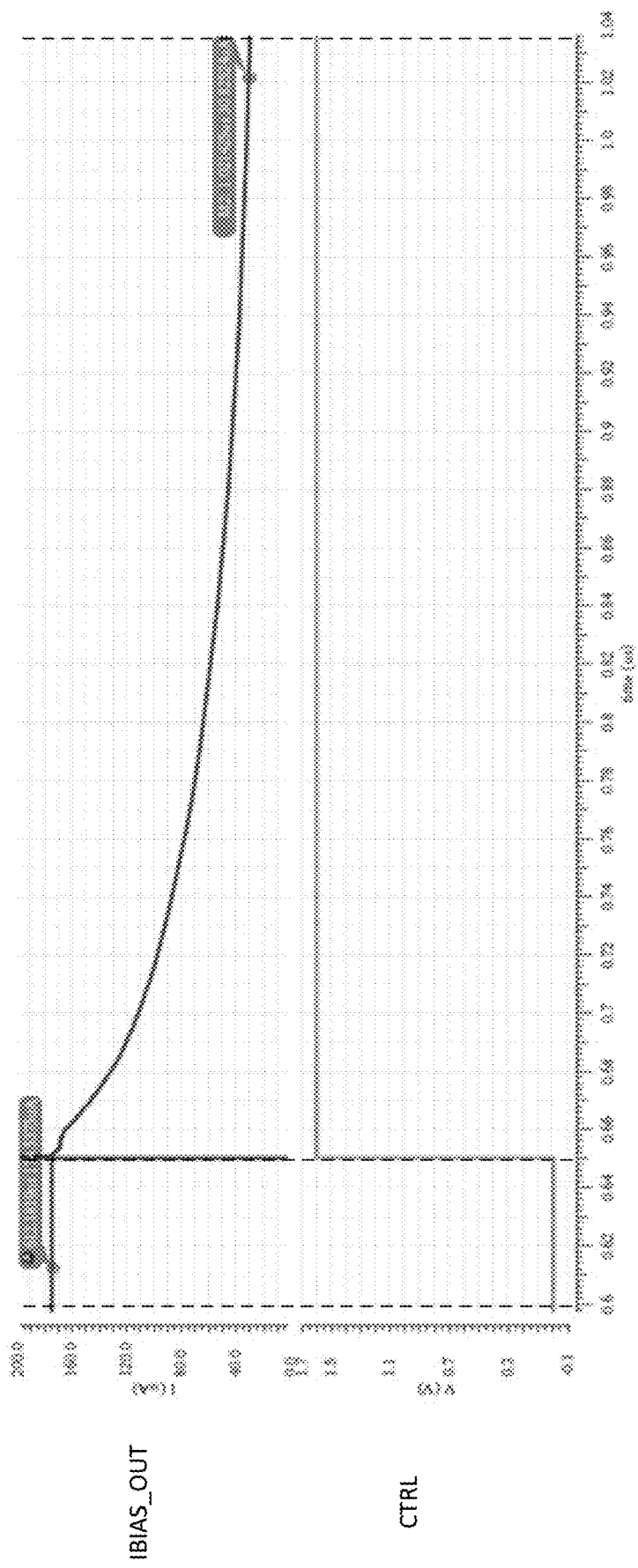
FIG. 4 is a graph showing the control signal and the variable bias current over time are shown.

An example of this operation can be seen in the graph of FIG. 4. As can be seen at time 0.6 µs, initially the control signal CTRL is low, meaning that the ADC 10 is not generating a sample at that time. As explained above, this disconnects and decouples the NMOS transistor MN6 from the NMOS transistor MN1. Therefore, the variable bias current IBIAS_OUT is constant at approximately 185 µA, and remains constant while the control signal CTRL is low.

However, at time 0.65 µs, the ADC 10 begins generating a sample, and therefore the control signal CTRL transitions high. As explained above, this connects NMOS transistors MN1 and MN6 in parallel, increasing the effective size of the NMOS transistor MN1, reducing the gate voltage of the NMOS transistor MN1. In response, as can be seen in FIG. 4 after time 0.65 µs, the variable bias current IBIAS_OUT begins to fall at a rate set by the RC time constant of the RC filter 16c.

Since the frequency of the control signal CTRL matches the conversion rate of the ADC 10, the lower the conversion rate of the ADC 10, the longer the control signal CTRL will remain high. The longer the control signal CTRL remains high, the longer the effective size of the NMOS transistor MN1 remains increased, the more the gate voltage of the NMOS transistor MN1 falls, and the more that the variable bias current IBIAS_OUT falls. Therefore, the lower the conversion rate of the ADC 10, the lower the variable bias current IBIAS_OUT will be compared to the fixed bias current IBIAS. Therefore, the lower the conversion rate of the ADC 10, the lower the power consumed by the common mode buffer 12. Examples of the common mode buffer 12 current consumption for different ADC 10 conversion rates can be seen in the table below compared to an example where a fixed bias current is used together with the power savings provided by the variable bias current.

| Conversion Rate | Sampling Time | Average Current Consumption With Adaptive Biasing | Average Current Consumption Without Adaptive Biasing | Power Savings |
|---|---|---|---|---|
| 5 MSPS | 35.71 ns | 160 µA | 170 µA | 5.88% |
| 2 MSPS | 89.29 ns | 154 µA | 165 µA | 6.66% |
| 1 MSPS | 178.57 ns | 115 µA | 162 µA | 29.01% |
| 500K SPS | 357.14 ns | 70 µA | 162 µA | 56.80% |
| 250K SPS | 714.29 ns | 44 µA | 162 µA | 72.84% |
| 100K SPS | 1785.71 ns | 27.7 µA | 162 µA | 82.90% |
| 10K SPS | 17857.14 ns | 18.68 µA | 162 µA | 88.47% |

As can be seen, the adaptive biasing control 16 and its production of the variable bias current IBIAS_OUT yields large drops in power consumption and according large gains in efficiency when the ADC 10 is operating at lower conversion rates.

It should be recognized that the above described principles are not limited to the connecting of one transistor in parallel with NMOS transistor MN1 during sampling by the ADC 10 to increase the effective size of NMOS transistor MN1, and that any number of transistors may be selectively connected in parallel with NMOS transistor MN1 so as to permit increase of its effective size by differing amounts.

Figure 5:
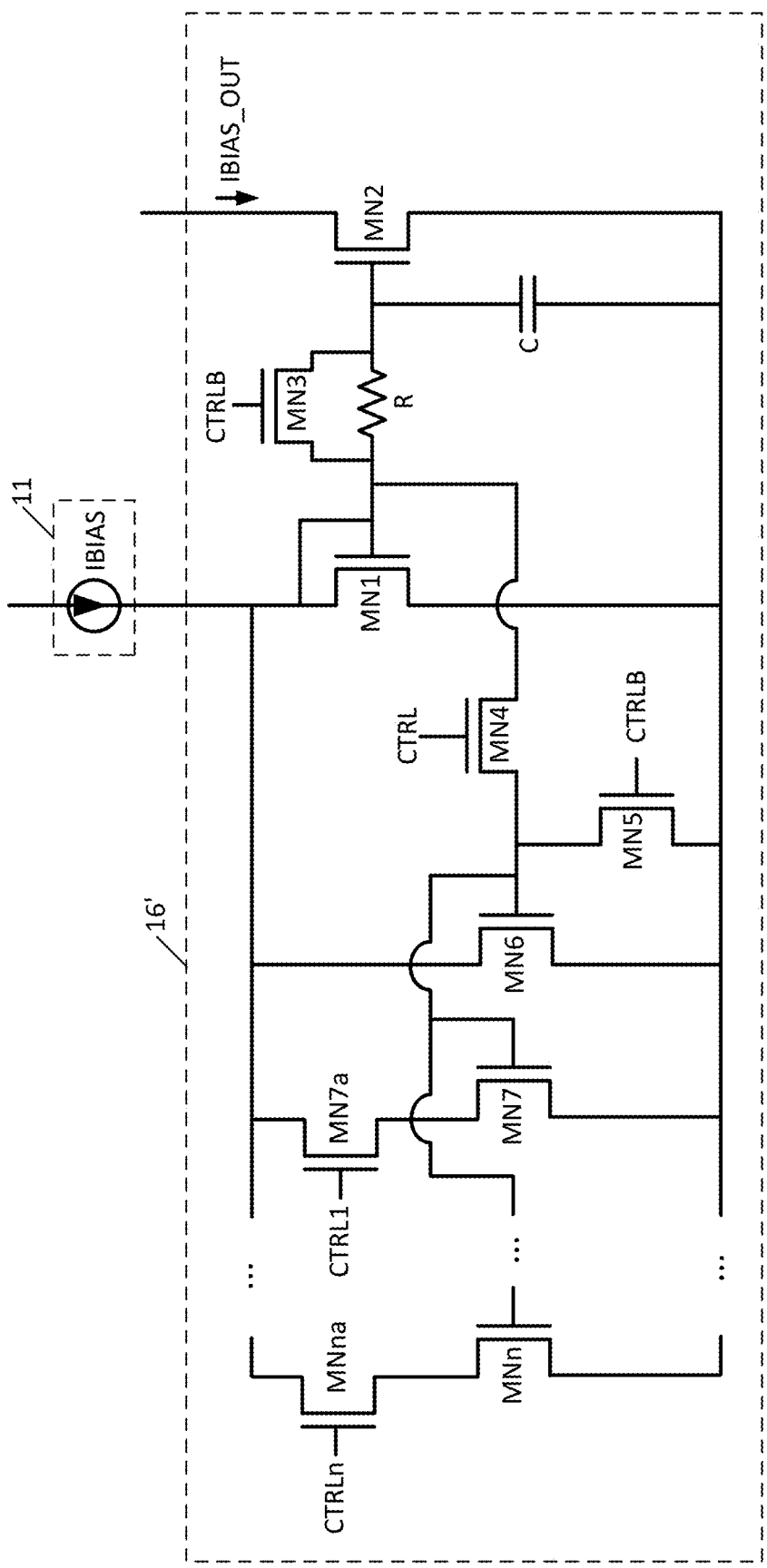
FIG. 5 is a schematic diagram showing another possible embodiment with more programming options for the biasing and adaptive biasing control circuits of FIGS. 2A-2B.

An expanded embodiment displaying this functionality is shown in FIG. 5. In this embodiment, the adaptive biasing control circuitry 16' (in addition to the structure from FIG. 5) also includes a plurality of additional parallel connectable NMOS transistors MN7, MNn, with n being any integer. Each additional parallel connectable NMOS transistor MN7, . . . , MNn has its source connected to ground, its drain selectively coupled to the drain of NMOS transistor MN1 through respective connector NMOS transistors MN7a . . . MNna, and its gate connected to the source of NMOS transistor MN4 and the gate of NMOS transistor MN6. Each connector NMOS transistor MN7a, MNna has its drain connected to the drain of NMOS transistor MN1, its source connected to the drain of its respective parallel connectable NMOS transistor MN7, . . . , MNn, and its gate connected to a different control signal CTRL1, . . . , CTRLn. The control signals CTRL1, . . . , CTRLn may be considered to selectively replicate the control signal CTRL. That is, one or more of the control signals CTRL1, . . . , CTRLn may be generated so as to replicate the control signal CTRL, and those control signals CTRL1, CTRLn that do not replicate the control signal CTRL remain low. This way, by setting which of the control signals CTRL1, . . . , CTRLn replicate the control signal CTRL, which additional parallel connectable NMOS transistors MN7, . . . , MNn are connected and coupled in parallel with NMOS transistor during samplings by the ADC 10 can be selected. This allows the embodiment of FIG. 5 to be used in a variety of different ADC circuits, as it is possible to tune how much the effective size of NMOS transistor MN1 is increased during samplings by the ADC 10.

A variant of the embodiment of FIG. 5 in which the parallel connectable NMOS transistors N7, MNn may be a different size from the NMOS transistor MN6 is envisioned, as is a variant in which some or all of the parallel connectable NMOS transistors MN7, MNn differ in size from one another.

Figure 6:
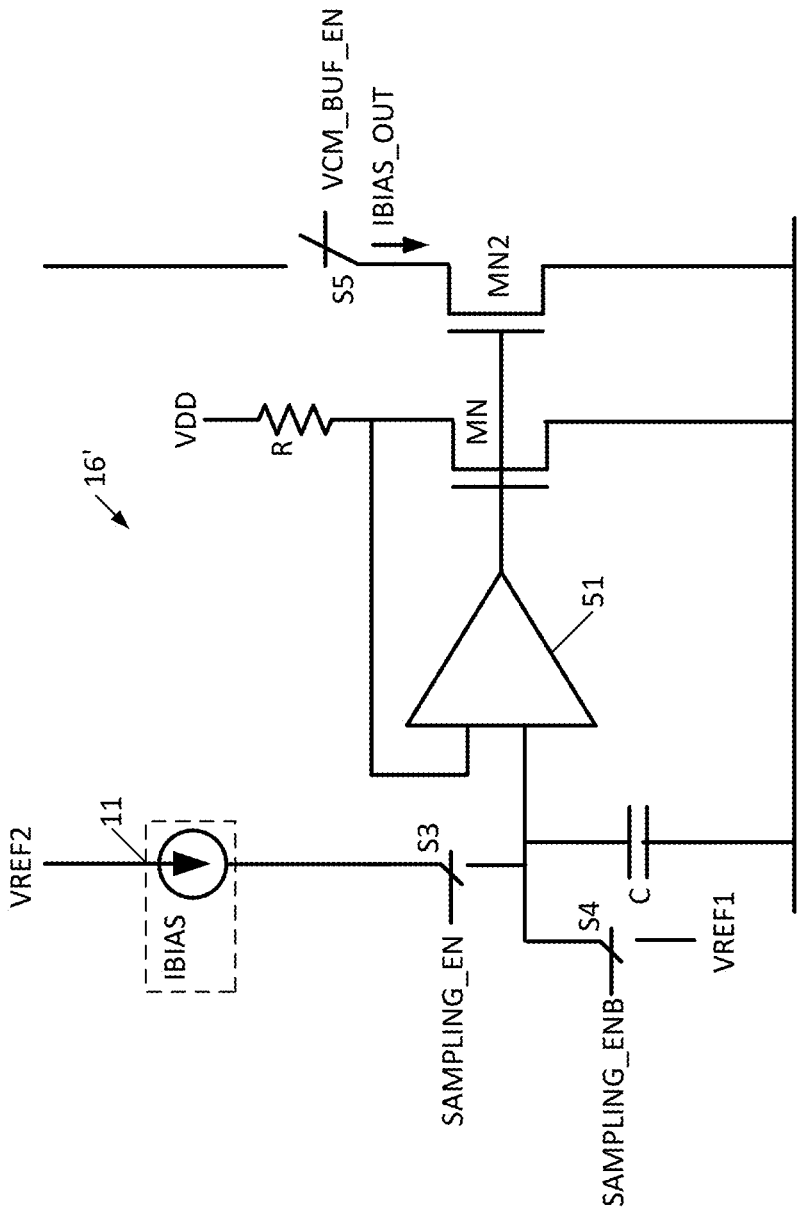
FIG. 6 is a schematic diagram of another embodiment of biasing and adaptive biasing and control circuits that may be used with ADCs of FIGS. 2A-22B.

Now described with reference to FIG. 6 is a different embodiment for the adaptive biasing control circuit 16'. Rather than using the effective increase of transistor size through parallel transistor coupling to achieve the desired reduction in bias current (that, as shown in FIG. 4, results in the bias decaying exponentially), the adaptive biasing control circuit 16' utilizes an operational amplifier 51 to yield a linear reduction in bias current. The adaptive biasing control circuit 16' therefore includes an operational amplifier 51 having a first terminal that is coupled to ground through a capacitor C, selectively coupled to the biasing current IBIAS generator 11 through a switch S3, and selectively coupled to a reference voltage VREF1 through a switch S4. The switch S3 is controlled by SAMPLING_EN, while the switch S4 is controlled by its complement SAMPLING_ENB. The biasing current generator 11 is tied to a reference voltage VREF2. The reference voltage VREF2 is less than the reference voltage VREF1.

An NMOS transistor MN has a source coupled to ground, a drain coupled to a second terminal of the operational amplifier 51, and a gate coupled to the output of the operational amplifier 51. A resistor R is coupled between the drain of the NMOS transistor MN and VDD.

An NMOS transistor MN2 has a source connected to ground, a drain at which the variable bias current IBIAS_OUT is generated, and a gate. The drain of NMOS transistor MN2 is selectively connected or disconnected from providing output by a switch S5. The switch S5 is controlled by the VCM buffer enable signal VCM_BUF_EN, such that when VCM_BUF_EN is high, IBIAS_OUT is generated as described below, but when VCM_BUF_EN is low, IBIAS_OUT is zero.

When SAMPLE_EN is low, the switch S3 is open while the switch S4 is closed, with the result being that IBIAS_OUT is equal to (VDD−VREF1)/R. When SAMPLE_EN goes high, the switch S3 closes while the switch S4 opens, with the result being that IBIAS_OUT linearly decays to (VDD−VREF2)/R, and this linear decay has a slope proportional to IBIAS/C.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   an amplifier having a first input, a second input and an output;
   a feedback circuit configured to generate a feedback voltage in response to a voltage at the output of the amplifier, the feedback circuit being coupled to the first input of the amplifier to provide the feedback voltage to the first input of the amplifier;
   an output circuit configured to generate a variable bias current in response to the voltage at the output of the amplifier; and
   a switch circuit configured to switch the second input of the amplifier from receiving a first reference voltage during a first mode of operation to receiving a second reference voltage during a second mode of operation.

2. The circuit of claim 1, wherein the feedback circuit comprises a feedback transistor circuit.

3. The circuit of claim 2, wherein the feedback transistor circuit comprises a first transistor having a first source/drain coupled to a first supply voltage through a resistor, a second source/drain directly electrically connected to a second supply voltage, and a gate directly electrically connected to the output of the amplifier, wherein the first source/drain of the first transistor is also directly electrically connected to the first input of the amplifier.

4. The circuit of claim 1, wherein the output circuit comprises an output transistor circuit.

5. The circuit of claim 4, wherein the output transistor circuit comprises a second transistor having a first source/drain selectively coupled through a second switch circuit to provide the variable bias current, a second source/drain directly electrically connected to a second supply voltage, and a gate directly electrically connected to the output of the amplifier.

6. The circuit of claim 1, wherein the first mode of operation comprises when a conversion circuit is not digitizing an input analog signal.

7. The circuit of claim 6, wherein the second mode of operation comprises when a conversion circuit is digitizing an input analog signal.

8. The circuit of claim 1, wherein the switch circuit includes a first switch; wherein a current generator generating a constant bias current is selectively coupled between the second reference voltage and the second input of the amplifier by the first switch; and wherein the first switch is configured to open during the first mode of operation, and to close during the second mode of operation.

9. The circuit of claim 1, further comprising a capacitor coupled between the second input of the amplifier and a second supply voltage.

10. The circuit of claim 1, further comprising a buffer configured to generate a common mode voltage from the variable bias current.

11. An analog to digital converter (ADC), comprising:
a conversion circuit configured to digitize an input analog signal to produce an output digital signal at a conversion rate, based upon a common mode voltage applied to the conversion circuit;
a variable bias current generator configured to generate a variable bias current that changes based upon whether the conversion circuit is digitizing the input analog signal; and
a buffer configured to generate the common mode voltage from the variable bias current for use by the conversion circuit.

12. The ADC of claim 11, wherein the variable bias current decays in magnitude in response to a change by the conversion circuit from not digitizing to digitizing.

13. The ADC of claim 12, wherein the decay of the variable bias current is exponential.

14. The ADC of claim 12, wherein the decay of the variable bias current is linear.

15. The ADC of claim 11, wherein the variable bias current generator comprises a current mirror circuit receiving a constant bias current at its input and generating a variable bias current at its output in response to the constant bias current, and a parallel transistor circuit configured to selectively couple in parallel with the input of the current mirror circuit in response to a control signal representative of a conversion rate of the digitizing, and configured to selectively couple in parallel with the output of the current mirror circuit in response to a control signal representative of a conversion rate of the digitizing.

16. The ADC of claim 15, wherein the control signal is asserted during each digitizing of the input analog signal and deasserted between each assertion of the input analog signal.

17. The ADC of claim 15, wherein the variable bias current generator comprises:
an amplifier having first and second inputs and an output;
a feedback circuit configured to generate a feedback voltage in response to a voltage at the output of the amplifier, the feedback circuit being coupled to the first input of the amplifier to provide the feedback voltage to the first input of the amplifier;
an output circuit configured to generate the variable bias current in response to the voltage at the output of the amplifier; and
a switch circuit configured to switch the second input of the amplifier from receiving a first reference voltage to receiving a second reference voltage dependent upon whether the conversion circuit is digitizing the input analog signal.

18. The ADC of claim 17, wherein the feedback circuit comprises a feedback transistor circuit.

19. The ADC of claim 18, wherein the feedback transistor circuit comprises a first transistor having a first source/drain coupled to a first supply voltage through a resistor, a second source/drain directly electrically connected to a second supply voltage, and a gate directly electrically connected to the output of the amplifier, wherein the first source/drain of the first transistor is also directly electrically connected to the first input of the amplifier.

20. The ADC of claim 17, wherein the output circuit comprises an output transistor circuit.

21. The ADC of claim 20, wherein the output transistor circuit comprises a second transistor having a first source/drain selectively coupled through a second switch circuit to provide the variable bias current, a second source/drain directly electrically connected to a second supply voltage, and a gate directly electrically connected to the output of the amplifier.

22. The ADC of claim 17, wherein the switch circuit includes a first switch; wherein a current generator generating a constant bias current is selectively coupled between the second reference voltage and the second input of the amplifier by the first switch; and wherein the first switch is configured to open during a first mode of operation, and to close during a second mode of operation.

23. The ADC of claim 17, further comprising a capacitor coupled between the second input of the amplifier and a second supply voltage.

* * * * *